(12) United States Patent
Trenchs et al.

(10) Patent No.: US 7,583,483 B2
(45) Date of Patent: Sep. 1, 2009

(54) VEHICLE AC GROUND FAULT DETECTION SYSTEM

(75) Inventors: Albert Trenchs, Valls (ES); Yann Darroman, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 11/867,274

(22) Filed: Oct. 4, 2007

(65) Prior Publication Data

US 2009/0091868 A1   Apr. 9, 2009

(51) Int. Cl.
   *H02H 5/04* (2006.01)
(52) U.S. Cl. .......................................... 361/42; 361/23
(58) Field of Classification Search .................. 361/35, 361/36, 38, 42–50, 23
   See application file for complete search history.

(56) References Cited

U.S. PATENT DOCUMENTS

| | | | |
|---|---|---|---|
| 4,542,432 A | 9/1985 | Nichols, III et al. | |
| 5,686,839 A | 11/1997 | Takagi | |
| 5,894,393 A | 4/1999 | Elliott et al. | |
| 6,381,110 B1 | 4/2002 | Nagashima et al. | |
| 6,788,504 B2 * | 9/2004 | Vanderkolk | 361/42 |
| 6,856,137 B2 | 2/2005 | Roden et al. | |
| 6,970,807 B2 * | 11/2005 | Kito et al. | 702/183 |
| 7,224,432 B2 | 5/2007 | Sasaki et al. | |
| 7,224,559 B2 | 5/2007 | Henze et al. | |
| 2005/0168892 A1 * | 8/2005 | Kuroda et al. | 361/42 |
| 2005/0259370 A1 | 11/2005 | Kubo | |
| 2007/0268636 A1 * | 11/2007 | Suzuki et al. | 361/48 |

* cited by examiner

*Primary Examiner*—Danny Nguyen
(74) *Attorney, Agent, or Firm*—MacMillan, Sobanski & Todd, LLC

(57) ABSTRACT

A vehicle ground fault detection system for detecting a ground fault includes a fault detection circuit having a resistance element. The resistance element has one side connected to a supply voltage. An electrical switching circuit is connected to the resistance element for selectably coupling the other side of the resistance element to a secondary ground. The fault detection circuit further includes a fault detection sense line connected to a junction between the other side of the resistance element and the electrical switching circuit. A controller selectably couples the resistance element to the secondary ground. The controller is coupled to the fault detection sense line to receive a voltage signal for detecting the ground fault prior to a start-up of the AC step-up power transformation. The controller determines a ground fault based on a comparison responsive to the voltage signal and a predetermined comparative value.

18 Claims, 3 Drawing Sheets

VEHICLE AC GROUND FAULT DETECTION SYSTEM

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Field of Invention

This invention relates in general to AC high power voltage systems within a vehicle, and in particular to, an AC ground fault detection system of a vehicle.

2. Background of Related Art

Vehicles are becoming increasingly accommodated to the use of passenger electronic convenience devices within the vehicle. Such devices typically run from a main DC power supply system where a typical 12 Vdc power supply is provided at one or more locations of the vehicle to accommodate powering a passenger's electrical convenience device.

For a vehicle system to accommodate a personal convenience device that utilizes AC power, the vehicle system must convert the DC voltage to an AC voltage. The DC voltage from the battery is converted to a low AC voltage (e.g., 12 Vac). Thereafter, the low AC voltage is provided to a transformer to step-up the voltage to a high voltage (e.g., 400 Vac). Thereafter, down converters may be used to step down the voltage to a 220 Vac or 110 Vac for providing power to a power outlet within the vehicle.

The power outlets and other AC load devices are locations where a passenger may come into contact with the AC voltage. If a passenger of the vehicle comes in contact with the high voltage power source, then isolation between the primary and secondary of the power system is lost. Current enters the passenger's body through the contacting portion (e.g., a hand) and exits through another portion of the body (e.g., the feet) that is contact with a ground (i.e., the vehicle). The passenger's body is basically electrically coupled to the vehicle resulting in electrical shock to the passenger and possible serious injury to the passenger.

BRIEF SUMMARY OF THE INVENTION

The present invention has the advantage of detecting a ground fault condition that would occur if a passenger contacts a high voltage outlet and providing a signal to the power distribution system to inhibit the activation of the low to high power transformer in order to prevent electrical shock to the passenger in contact with the high power circuit.

In one aspect of the present invention, a vehicle ground fault electrical detection system is provided for a vehicle AC electrical system. The AC electrical system includes an AC step-up voltage transformer having a primary coil and a secondary coil for increasing the voltage supplied to the transformer. The secondary coil is coupled to a secondary ground. The voltage supplied to the primary coil of the transformer is a converted voltage from a vehicle battery having a battery ground. The ground fault electrical detection system includes a fault detection circuit for detecting a short circuit between a secondary ground of the transformer and a battery ground. The fault detection circuit includes a resistance element having a predetermined resistance value. The resistance element has one side connected to a supply voltage. An electrical switching circuit is connected to the resistance element for selectably coupling the other side of the resistance element to the secondary ground. The fault detection circuit further includes a fault detection sense line connected to a junction between the other side of the resistance element and the electrical switching circuit. A controller selectably couples the resistance element to the secondary ground. The controller is coupled to the fault detection sense line to receive a voltage signal for detecting the ground fault prior to a start-up of the AC step-up power transformation. The controller determines a ground fault based on a comparison responsive to the voltage signal and a predetermined comparative value.

In yet another aspect of the present invention, a vehicle ground fault detection system is provided for detecting a ground fault in a vehicle electrical circuit. The system includes an AC step-up voltage circuit including an AC transformer having a primary coil and a secondary coil for increasing a rectified voltage supplied to the AC transformer. A microprocessor is provided for determining a fault detection within the AC step-up voltage circuit. A fault detection circuit is provided for detecting a short circuit between a secondary ground of the transformer and a battery ground. The fault detection circuit includes a resistance element having a predetermined resistance value. The resistance element is connected to a supply voltage. An electrical switching circuit is connected to the resistance element for and the secondary ground.

In yet another aspect of the present invention, a method for detecting a ground fault in a vehicle AC electrical system is provided. The vehicle AC electrical system includes an AC step-up transformer having a primary coil and a secondary coil for increasing the voltage supplied to the AC transformer. A fault detection circuit includes a supply voltage input line connected to a resistive element. The fault detection circuit further includes an electrical switching circuit and a fault detection sense line. The method for detecting the ground fault includes the steps of selectively coupling the supply voltage input line to a secondary ground via the electrical switching circuit. The fault detection sense line is monitored. A determination is made whether a ground fault is present within the vehicle AC electrical system prior to an AC voltage step-up transformation.

Various objects and advantages of this invention will become apparent to those skilled in the art from the following detailed description of the preferred embodiments, when read in light of the accompanying drawings.

DETAILED DESCRIPTION OF THE PREFERRED EMBODIMENT

Figure 1:
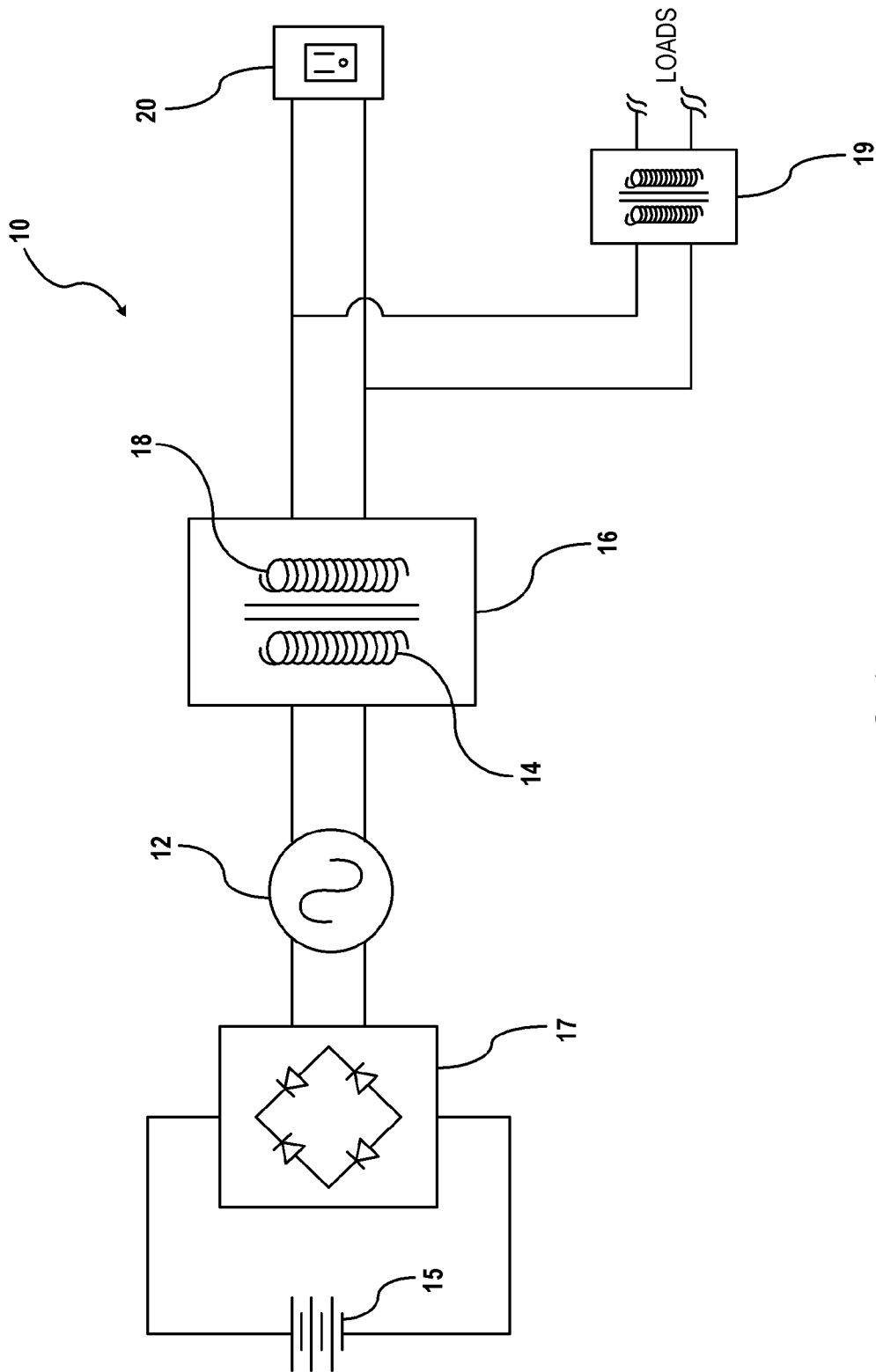
FIG. 1 is a block diagram of a vehicle power supply conversion system of the present invention.

Referring now to the drawings, there is illustrated in FIG. 1 a power supply circuit, shown generally at 10, for increasing the supply voltage to a load device. The power supply circuit 10 includes supply voltage 12 that is provided to a primary coil 14 of a transformer 16. The supply voltage is a low AC voltage (e.g., 12 VAC) converted from DC power source 15. The DC power is converted to the supply voltage via inverter shown generally at 17. The power provided to the primary coil 14 is stepped up to a high AC voltage such as 220 VAC or 400 VAC) at the secondary coil 18. An electrical outlet 20 is coupled to the secondary coil 18 for electrical coupling to an AC-based personal convenience device. The power supply circuit 10 may include one or more additional transformers for stepping down or up the voltage for supplying AC power to various loads 19 throughout the vehicle. The present invention provides a means for detecting an object in contact with the high voltage side of the transformer 16.

Figure 2:
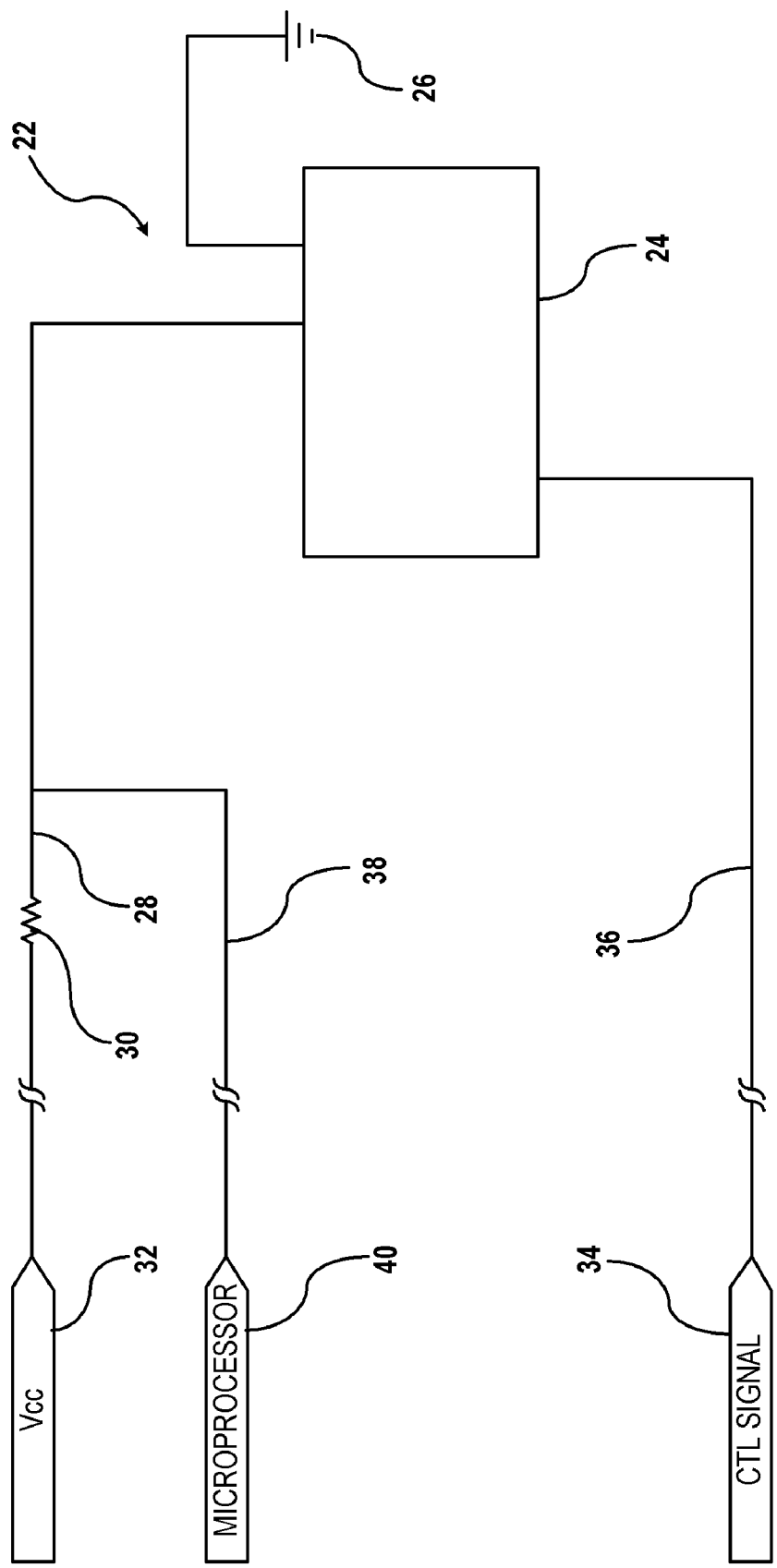
FIG. 2 is an electrical schematic of a fault detection system according to a first embodiment of the present invention.

FIG. 2 illustrates an electrical schematic of a first embodiment of a fault detection system 22. The fault detection system 22 includes an electrical switching circuit 24 connected to a secondary ground 26. The secondary ground 26 is a same ground as that of the secondary coil 18 of the AC transformer 16 (FIG. 1). The electrical switch circuit 24 is electrically connected to an input supply voltage line 28. The input supply voltage line 28 includes a resistance element 30, such as a resistor, having a predetermined resistance value. The input supply voltage line 28 is connected to a supply voltage 32 from a DC supply source. The resistance element 30 is coupled on the input supply voltage line 28 between the supply voltage source and the electrical switching circuit 24.

A control input command signal 34 is transmitted on a control signal line 36 which is connected to the electrical switching circuit 24. The control input command signal 34 transmitted to the electrical switching circuit 24 commands the electrical switching circuit 24 to internally couple the input supply voltage line 28 to the secondary ground 26. This provides a known voltage and current input to the secondary ground 26.

A fault detection sense line 38 is coupled to the input supply voltage line 28 between the resistance element 30 and the electrical switching circuit 24. The fault detection sense line 38 is coupled to a microprocessor 40 or similar device for monitoring the voltage on the fault detection sense line 38. Preferably, the microprocessor 40 is not integrated as part of electrical switching circuit 24 but is part of another electrical component/subsystem since the use of a dedicated microprocessor solely for the fault detection system would be unwarranted and not cost effective. However, in alternative embodiments microprocessor may be integrated within the electrical switching circuit or the microprocessor itself may be used as the switching circuit.

The fault detection operation occurs prior to the start up the AC step-up power transformation. That is, prior to the ignition being turned on and the AC transformer being energized for stepping up the AC voltage, a fault detection routine is initiated. The supply voltage (e.g., 5 Vdc) is provided on the input supply voltage line 28. Prior to electrical switching circuit 24 receiving a control input command signal 34, the input supply voltage line 28 is open or at least not coupled to the secondary ground 26. When a control input command signal 34 is provided to the electrical switching circuit 24, the electrical switching element 24 internally connects the input supply voltage line 28 to the secondary ground 26. The microprocessor 40 monitors the fault detection sense line 38. The architecture of the fault detection sense line 38, resistance element 30, and the secondary ground 26 form a voltage bridge divider. The voltage measured by the microprocessor 40 represents the low-side resistor voltage. Either the measured voltage or a comparative value that is a function of the measured voltage can be compared with a predetermined comparative value for determining the ground fault. A comparative value that is a function of the measured voltage such an isolation resistance can be determined the based on the voltage bridge divider using the following formula:

$$R_{isolation} = (R_1 * V_{measured})/(V_{cc} - V_{measured})$$

where $R_1$ is the resistance value of the resistance element 30, $V_{measured}$ is the voltage measured by the microprocessor 40 on the fault detection sense line 38, and $V_{cc}$ is the supply voltage 32. Based on the determined isolation resistance a ground fault may be detected. For example, if the resistance element 30 has a resistance value of 100 kΩ, then a calculated isolation resistance value ($R_{isolation}$) of 80 kΩ or less is indicative that an object creating a short between the secondary ground and the battery ground. As a result, the fault detection can be detected. Therefore, for a resistance element having a predetermined resistance value, a predetermined isolation resistance (or predetermined voltage) is compared with the calculated isolation resistance (or measured voltage) on the fault detection sense line 38 for indicating whether a fault is present in the AC electrical system.

Figure 3:
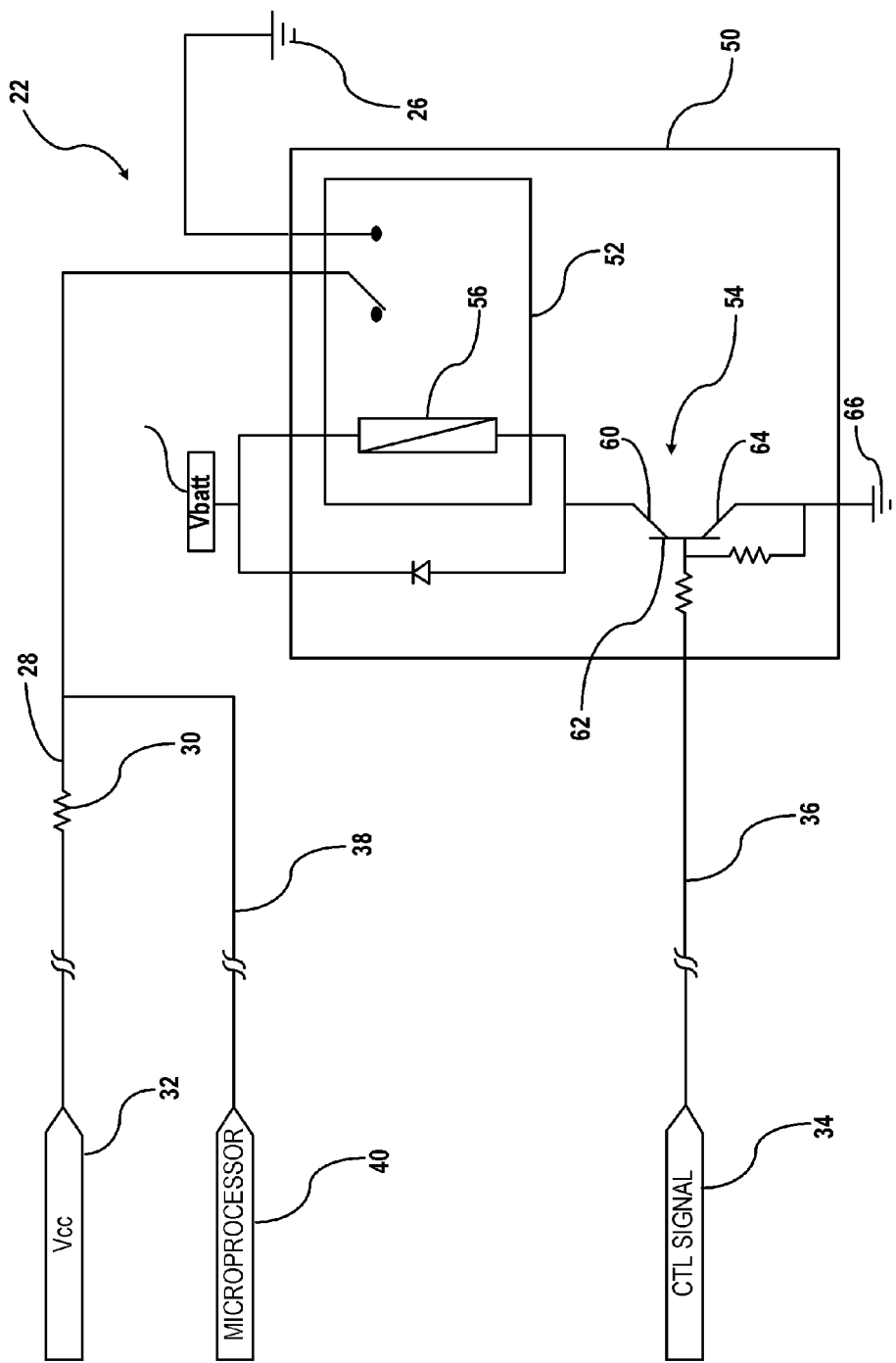
FIG. 3 is an electrical schematic of a fault detection system according to a second embodiment of the present invention.

FIG. 3 illustrates a schematic of a fault detection circuit according to a second preferred embodiment. An electrical switching circuit 50 is shown having a relay 52 and a power switch 54. The relay 52 includes a relay coil 56. An input of the relay coil 56 is coupled to a battery voltage 58. An output of the relay coil 56 is coupled to the power switch 54 which will be discussed in detail below. When the relay coil 56 is coupled to ground, the relay coil 56 is energized and the relay 52 connects the input supply voltage line 28 to the secondary ground 26 as described.

The output of the relay coil 56 is coupled to the collector 60 of the power switch 54. The control signal line 36 is coupled to the base 62 of the power switch 54. The emitter 64 is coupled to a battery ground 66. When a control command input signal 34 is generated on the control signal line 36 to the base 62, an electrical connection is completed between the collector 60 and the emitter 64 and thereafter to the battery ground 66. As a result, the output of the relay coil 56 is connected to battery ground 66 thereby allowing current flow to energize the relay coil 56. Energizing the relay coil 56 connects the input supply voltage line 28 to the secondary ground 26 via the relay 52. The microprocessor 40 thereafter monitors the fault detection sense line 38 for detecting a fault.

Alternatively, the power switch 54 may include a power relay, Mosfet, or other similar device. Moreover, the electrical switching circuit may include other electrical configurations including but not limited to an application specific integrated circuit (ASIC). It must be understood that this invention may be practiced otherwise than as specifically explained and illustrated without departing from its spirit or scope, and that other electrical components may be used to monitor and couple the input supply voltage line to the secondary ground so that a fault may be detected within the AC electrical power transformation system.

What is claimed is:

1. A vehicle ground fault electrical detection system for a vehicle AC electrical system, the AC electrical system including an AC step-up voltage transformer having a primary coil and a secondary coil for increasing the voltage supplied to the transformer, the secondary coil being coupled to a secondary ground, the voltage supplied to the primary coil of the transformer being a converted voltage from a vehicle battery having a battery ground, the ground fault electrical detection system comprising:
- a fault detection circuit for detecting a short circuit between a secondary ground of the transformer and a battery ground, the fault detection circuit comprising:
  - a resistance element having a predetermined resistance value, the resistance element having one side connected to a supply voltage;
  - an electrical switching circuit connected to the resistance element for selectably coupling the other side of the resistance element to the secondary ground;
  - a fault detection sense line connected to a junction between the other side of the resistance element and the electrical switching circuit; and
  - a controller for selectably coupling the resistance element to the secondary ground, the controller being coupled to the fault detection sense line to receive a voltage signal for detecting the ground fault prior to a start-up of the AC step-up power transformation, the controller determining a ground fault based on a comparison responsive to the voltage signal and a predetermined comparative value.

2. The ground fault detection system of claim 1 wherein the fault detection sense line, the resistive element, and the secondary ground form a voltage bridge divider.

3. The ground fault detection system of claim 1 wherein the controller includes a microprocessor.

4. The ground fault detection system of claim 1 wherein the electrical switching circuit includes a power switch and a relay, the power switch coupling the relay to ground for energizing a relay coil of the relay, wherein the relay coil when energized couples the supply voltage via the resistance element to secondary ground.

5. The ground fault detection system of claim 4 wherein the power switch includes a power relay.

6. The ground fault detection system of claim 4 wherein the power switch includes a Mosfet.

7. A vehicle ground fault detection system for detecting a ground fault in a vehicle electrical circuit, the system comprising:
- an AC step-up voltage circuit including an AC transformer having a primary coil and a secondary coil for increasing a voltage supplied to the AC transformer;
- a microprocessor for determining a fault detection within the AC step-up voltage circuit;
- a fault detection circuit for detecting a short circuit between a secondary ground of the transformer and a battery ground, the fault detection circuit comprising:
  - a resistance element having a predetermined resistance value, the resistance element connected to a supply voltage;
  - an electrical switching circuit connected to the resistance element for and the secondary ground; and
  - a fault detection sense line connected between the resistance element and the electrical switching circuit;
  - wherein the electrical switching circuit selectively couples the supply voltage via the resistance element to the secondary ground, andthe microprocessor monitors the fault detection sense line for determining an occurrence of the ground fault prior to a start-up of the AC step-up power transformation.

8. The ground fault detection system of claim 7 wherein the microprocessor determines an isolation resistance as a function of the measured voltage.

9. The ground fault detection system of claim 8 wherein a calculated isolation resistance of less than the resistance of the resistance element is determinative of a ground fault.

10. The ground fault detection system of claim 7 wherein the microprocessor generates a control signal for inhibiting the AC step-up power transformation in response to determining the occurrence of the ground fault.

11. The ground fault detection system of claim 7 wherein the electrical switching circuit includes a power switch and a relay, the power switch coupling the relay to ground for energizing a relay coil of the relay, wherein the relay coil when energized couples the supply voltage via the resistance element to secondary ground.

12. The ground fault detection system of claim 7 wherein the fault detection sense line, the resistive element, and the secondary ground form a voltage bridge divider.

13. A method for detecting a ground fault in a vehicle AC electrical system that includes an AC step-up transformer having a primary coil and a secondary coil with a secondary ground and a fault detection circuit that includes a supply voltage input line connected to a resistive element, an electrical switching circuit is connected between the resistive element and the secondary ground, and a fault detection sense line, the method for detecting the ground fault comprising the steps of:
- selectively coupling the resistive element to the secondary ground via the electrical switching circuit;
- monitoring the fault detection sense line; and
- determining a ground fault within the vehicle AC electrical system prior to an AC voltage step-up transformation in response to the monitoring of the fault detection sense line.

14. The method of claim 13 wherein a microprocessor is connected to the fault detection sense line for monitoring a voltage on the fault detection sense line and for determining the occurrence of the ground fault.

15. The method of claim 14 wherein the step of determining the occurrence of the ground fault includes determining an isolation resistance as a function of the measured voltage, wherein the determined isolation resistance being less than a predetermined resistance value is indicative of a ground fault.

16. The method of claim 14 wherein the step of determining the occurrence of the ground fault includes determining an isolation resistance as a function of the measured voltage, wherein the determined isolation resistance being less than a resistance value of the resistance element is indicative of a ground fault.

17. The method of claim 13 further comprising the step of supplying an inhibit signal for inhibiting the AC step-up conversion, the inhibit signal being in response to determining the presence of the ground fault prior to an AC step-up transformation.

18. The method of claim 17 wherein the step of determining the ground fault is performed prior to turning the vehicle ignition to a run position.

* * * * *